United States Patent
Pibre et al.

(10) Patent No.: US 12,550,617 B2
(45) Date of Patent: Feb. 10, 2026

(54) PIEZOELECTRIC COMPOSITE MATERIALS HAVING IMPROVED PIEZOELECTRIC PROPERTIES

(71) Applicant: COMPAGNIE GENERALE DES ETABLISSEMENTS MICHELIN, Clermont-Ferrand (FR)

(72) Inventors: Guillaume Pibre, Clermont-Ferrand (FR); Francois Lafort, Clermont-Ferrand (FR)

(73) Assignee: COMPAGNIE GENERALE DES ETABLISSEMENTS MICHELIN, Clermont-Ferrand (FR)

(*) Notice: Subject to any disclaimer, the term of this patent is extended or adjusted under 35 U.S.C. 154(b) by 822 days.

(21) Appl. No.: 17/788,344

(22) PCT Filed: Dec. 16, 2020

(86) PCT No.: PCT/FR2020/052470
§ 371 (c)(1),
(2) Date: Jun. 23, 2022

(87) PCT Pub. No.: WO2021/130434
PCT Pub. Date: Jul. 1, 2021

(65) Prior Publication Data
US 2023/0049031 A1  Feb. 16, 2023

(30) Foreign Application Priority Data
Dec. 23, 2019 (FR) ........................... 1915438

(51) Int. Cl.
*H10N 30/853* (2023.01)
*H10N 30/067* (2023.01)
(Continued)

(52) U.S. Cl.
CPC ......... *H10N 30/853* (2023.02); *H10N 30/067* (2023.02); *H10N 30/074* (2023.02); *H10N 30/093* (2023.02)

(58) Field of Classification Search
CPC .. H10N 30/853; H10N 30/067; H10N 30/074; H10N 30/093; H10N 30/852; H10N 30/092
See application file for complete search history.

(56) References Cited

U.S. PATENT DOCUMENTS

| 8,138,246 B2 | 3/2012 | Kato et al. |
| 11,545,614 B2* | 1/2023 | Guhathakurta ...... H10N 30/302 |

(Continued)

FOREIGN PATENT DOCUMENTS

| CN | 106750656 A | 5/2017 |
| CN | 110199399 A | 9/2019 |

(Continued)

OTHER PUBLICATIONS

International Search Report dated Feb. 9, 2021, in corresponding PCT/FR2020/052470 (4 pages).

(Continued)

*Primary Examiner* — Emily P Pham
(74) *Attorney, Agent, or Firm* — VENABLE LLP

(57) ABSTRACT

A piezoelectric composite material is based on a polymeric matrix and on piezoelectric inorganic fillers, characterized in that the material additionally comprises at least one ionic liquid of general formula Q+ A−, in which Q+ represents a cation chosen from quaternary ammonium cations and quaternary phosphonium cations and A− represents any anion capable of forming a liquid salt at a temperature of less than 100° C. A device comprising at least one layer based at least one piezoelectric composite material defined above and at least two electrodes positioned on either side of the layer and (Continued)

a tire comprising at least one piezoelectric device defined above are also set forth.

15 Claims, 1 Drawing Sheet

(51) Int. Cl.
*H10N 30/074* (2023.01)
*H10N 30/093* (2023.01)

(56) References Cited

U.S. PATENT DOCUMENTS

| | | | |
|---|---|---|---|
| 2009/0293590 A1* | 12/2009 | Zeng | G01N 29/022 73/24.06 |
| 2010/0035158 A1 | 2/2010 | Kato et al. | |
| 2015/0134061 A1 | 5/2015 | Friis et al. | |
| 2019/0058108 A1 | 2/2019 | Guhathakurta et al. | |
| 2019/0284423 A1 | 9/2019 | Bodkhe et al. | |
| 2019/0334078 A1 | 10/2019 | Araujo Da Silva et al. | |
| 2020/0303621 A1* | 9/2020 | Guhathakurta | C08K 3/22 |
| 2021/0245553 A1 | 8/2021 | Lafort et al. | |
| 2021/0257538 A1 | 8/2021 | Lafort et al. | |
| 2022/0402312 A1 | 12/2022 | Mangone et al. | |
| 2023/0122032 A1 | 4/2023 | Pibre et al. | |

FOREIGN PATENT DOCUMENTS

| | | |
|---|---|---|
| CN | 112313084 A | 2/2021 |
| EP | 2071584 A1 | 6/2009 |
| EP | 2654094 A1 | 10/2013 |
| JP | 2013-21176 A | 1/2013 |
| JP | 2016-65209 A | 4/2016 |
| KR | 10-1322838 B1 | 10/2013 |
| WO | 97/36724 A2 | 10/1997 |
| WO | 99/16600 A1 | 4/1999 |
| WO | 2016/157092 A1 | 10/2016 |
| WO | 2019/243749 A1 | 12/2019 |
| WO | 2019/243750 A1 | 12/2019 |

OTHER PUBLICATIONS

J. Capsal, et al., "Nanotexture influence of BaTiO3 particles on piezoelectric behaviour of PA 11/BaTiO3 nanocomposites", J. Non-Crystalline Solids 356 (2010) 629-634.

T. Furukawa, et al., "Electromechanical Properties in the Composites of Epoxy Resin and PZT Ceramics", Japanese J. Appl. Phys., vol. 15, No. 11, pp. 2119-2129 (1976).

K.A. Hanner, et al., "Thin Film 0-3 Polymer/Piezoelectric Ceramic Composites: Piezoelectric Paints", Ferroelectrics, 1989, vol. 100, pp. 255-260.

X. Liu, et al., "Piezoelectric and dielectric properties of PZT/PVC and graphite doped with PZT/PVC composites", Materials Science and Engineering B 127 (2006) 261-266.

G. Rujijanagul, et al., "Effect of the particle size of PZT on the microstructure and the piezoelectric properties of 0-3 PZT/polymer composites", J. Materials Science Letters 20, 2001, 1943-1945.

F. Vilmin, et al., "Fast and Robust Method for the Determination of Microstructure and Composition in Butadiene, Styrene-Butadiene, and Isoprene Rubber by Near-Infrared Spectroscopy", Applied Spectroscopy, vol. 60, No. 6, pp. 619-630 (2006).

J. Pernak, et al., "Ionic liquids „in a nutshell" (history, properties and development), Chemik 2016, 70, 9, 471-480.

S.M. Villa, et al., "Soft Piezoionic/Piezoelectric Nanocomposites Based on Ionogel/BaTiO3 Nanoparticles for Low Frequency and Directional Discriminative Pressure Sensing", ACS Macro Lett. 2019, 8, 414-420.

* cited by examiner

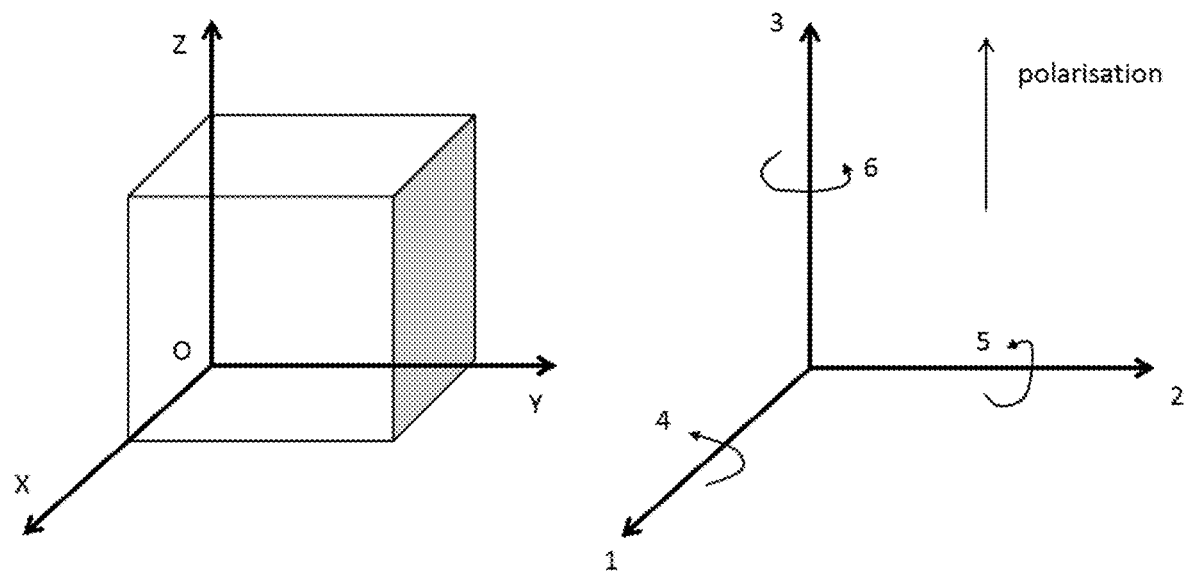

PIEZOELECTRIC COMPOSITE MATERIALS HAVING IMPROVED PIEZOELECTRIC PROPERTIES

The present invention relates to a piezoelectric composite material, to the process for obtaining it and to the use of such a material in devices such as piezoelectric actuators and/or detectors, or energy generators.

Many articles comprise piezoelectric composite materials for their operation. Specifically, they are found in acoustic transducers, in pressure and/or acceleration sensors, energy generators, sound-insulating materials, in piezoelectric actuators and/or detectors used, for example, in atomic force electron microscopy or else used in tyres for monitoring the behaviour of the latter.

Piezoelectricity is a physical phenomenon which corresponds to the appearance of an electrical polarization induced by an external mechanical deformation. It is an electromechanical coupling where the polarization is proportional to the mechanical stress applied up to a certain level. The piezoelectric effect is then said to be direct. This phenomenon is reversible: when the material is subjected to an external electric field, it is deformed. This is the inverse piezoelectric effect.

A variation in the macroscopic polarization when applying a stress to the sample characterizes the piezoelectric effect. In a system of orthogonal axes, the polarization and the stress are linked in matrix notation by a 2nd rank tensor referred to as piezoelectric tensor $d_{ij}$ with i and j corresponding respectively to the axis of polarization (1, 2, 3) and of application of the stress (1, 2, 3, 4, 5, 6), as shown in FIG. 1.

The materials which have piezoelectric properties are classified into three major classes: piezoelectric inorganic materials, piezoelectric polymers and piezoelectric composite materials.

These three major classes of piezoelectric materials in particular do not have the same properties of dielectric permittivity, of remanent polarization, of coercive field, and the like.

The properties of piezoelectric inorganic materials, such as, for example, lead zirconate titanates (PZTs), are very often linked to their crystalline structure, while those of piezoelectric polymers (organic materials) originate from the presence of permanent dipoles intrinsic to the monomers constituting these polymers. The best known piezoelectric polymer is PVDF.

A piezoactive or piezoelectric composite material comprises at least one piezoelectric material, which gives the composite material its piezoelectric activity, and one or more non-piezoelectric phases. This combination results in a composite material having enhanced performance qualities compared to each phase alone. The non-piezoelectric phase is generally an organic polymer matrix, in particular a rigid thermoplastic or thermosetting polymer matrix (US2015/134061, WO2016/157092), which can be of polyamide type (Capsal et al., Journal of Non-Crystalline Solids, 2010, 356, 629-634), polyepoxy type (Furukawa et al., Jpn. J. Appl. Phys., 1976, 15, 2119), polystyrene type, polyurethane type (Hanner et al., Ferroelectrics, 1989, 100, 255-260), PVC type (Liu et al., Materials Science and Engineering, 2006, 127, 261-266) or also polyethylene type (Rujijanagul et al., Journal of Materials Science Letters, 2001, 20, 1943-1945), a polymer matrix comprising cyanoethylated polyvinyl alcohol (EP 2 654 094) or a polymer matrix comprising a diene elastomer (PCT/FR2019/051514).

Piezoelectric properties are used in many applications with increasing miniaturization, which requires having available composite materials having increasingly elevated piezoelectric properties.

The aim of the present invention is thus to meet this need and to provide a new piezoelectric composite material exhibiting improved piezoelectric properties in comparison with the piezoelectric composite materials of the prior art.

The Applicant has found that the addition of a specific compound, an ionic liquid, to a piezoelectric composite material made it possible, surprisingly, to improve its piezoelectric properties.

Thus, the invention relates to a piezoelectric composite material based on a polymeric matrix and on piezoelectric inorganic fillers, characterized in that said material additionally comprises at least one ionic liquid of general formula $Q^+A^-$, in which $Q^+$ represents a cation chosen from quaternary ammonium cations and quaternary phosphonium cations and $A^-$ represents any anion capable of forming a liquid salt at a temperature of less than 100° C.

More particularly, the piezoelectric composite material according to the invention can advantageously exhibit at least one of the following preferred characteristics taken alone or in combinations.

Preferentially, the cation $Q^+$ is a quaternary ammonium cation selected from the group consisting of imidazolium cations, pyrazolium cations, pyridinium cations, pyrimidinium cations, tetra($C_1$-$C_6$)alkylammonium cations, guanidinium cations and pyrrolidium cations.

Preferentially, the $Q^+$ cation is an imidazolium cation corresponding to the formula (I):

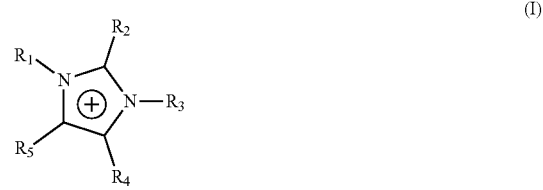

in which $R_1$ represents an alkyl group comprising from 1 to 15 carbon atoms, preferably from 1 to 10 carbon atoms, optionally substituted by one or more $C_6$-$C_{30}$ aryl, thiol or hydroxy groups or interrupted by one or more oxygen or sulfur atoms or by one or more NR' groups, $R_2$, $R_3$, $R_4$, $R_5$ and R', which are identical or different, each represent a hydrogen atom or an alkyl group comprising from 1 to 6 carbon atoms, preferably from 1 to 4 carbon atoms, or a $C_6$-$C_{30}$ aryl group, optionally substituted by one or more $C_1$-$C_4$ alkyl groups.

Preferentially, the $Q^+$ cation is selected from the group consisting of 1-ethyl-3-methylimidazolium, 1-butyl-3-methylimidazolium, 1-hexyl-m-methylimidazolium, 1-octyl-3-methylimidazolium, 1-decyl-3-methylimidazolium, 1,3-dibutylimidazolium and 1-butyl-2,3-dimethylimidazolium.

Preferentially, the $A^-$ anion is selected from the group consisting of acetate, trifluoroacetate, propionate, chloride, hydroxide, sulfate, trifluoromethanesulfonate, pentafluoromethanesulfonate and phosphates; preferably, $A^-$ is acetate or propionate.

Preferably, the content of ionic liquid is greater than or equal to 0.1 part by weight per hundred parts by weight of polymer, preferably is within a range extending from 0.1 to 15 parts by weight per hundred parts by weight of polymer, more preferentially from 0.5 to 12 parts by weight per hundred parts by weight of polymer, more preferentially still from 1 to 10 parts by weight per hundred parts by weight of polymer.

Preferentially, the piezoelectric inorganic filler is chosen from piezoelectric ceramics, advantageously chosen from ferroelectric oxides, advantageously having a perovskite structure.

Preferably, the piezoelectric inorganic filler is chosen from bariumtitanate, lead titanate, lead zirconate titanate, lead niobate, lithium niobate, potassium niobate and their mixtures; more preferentially, the piezoelectric inorganic filler is chosen from barium titanate, lead zirconate titanate, potassium niobate and their mixtures.

Preferentially, the piezoelectric inorganic filler is selected from the group consisting of barium titanate, potassium niobate and their mixtures.

Preferentially, the size of the particles of the piezoelectric inorganic filler is within a range extending from 50 nm to 800 µm.

Preferentially, the content of piezoelectric inorganic fillers is within a range extending from 5% to 80% by volume, with respect to the total volume of said material, more preferentially from 6% to 60% and more preferentially still from 7% to 50%.

Preferentially, the polymeric matrix comprises at least one polymer selected from the group consisting of thermoplastic polymers, thermoplastic elastomers, thermosetting polymers, diene elastomers and the mixtures of these polymers.

Preferentially, the polymeric matrix comprises at least one thermoplastic elastomer and/or one diene elastomer.

Preferentially, the polymer matrix predominantly comprises a diene elastomer.

Preferentially, the polymer matrix comprises from 75 phr to 100 phr, more preferentially from 90 phr to 100 phr and more preferentially still from 95 to 100 phr of diene elastomer.

Preferentially, the polymeric matrix comprises at least one diene elastomer selected from the group consisting of natural rubber, ethylene/propylene/diene monomer copolymers, synthetic polyisoprenes, polybutadienes, butadiene copolymers, isoprene copolymers and the mixtures of these diene elastomers.

Preferentially, the diene elastomer of the polymeric matrix is selected from the group consisting of polybutadienes, butadiene/styrene copolymers, butadiene/isoprene copolymers, butadiene/styrene/isoprene copolymers and the mixtures of these diene elastomers; more preferentially, the diene elastomer is the styrene/butadiene copolymer.

Preferentially, the piezoelectric composite material additionally comprises at least one crosslinking system; preferably, this crosslinking system comprises at least one peroxide.

The invention also relates to a device comprising at least one layer based on at least one piezoelectric composite material defined above and on at least two electrodes positioned on either side of said layer.

Preferentially, the electrodes are made of metal.

Preferentially, the metal of the electrode is selected from the group consisting of silver, gold, nickel, palladium, aluminium, copper, titanium and their mixture, preferably is gold.

Preferentially, according to one embodiment, the electrode is flexible and is a layer E is a conductive rubber composition based on at least 50 phr of diene elastomer, on a graphitized or partially graphitized carbon black and on a crosslinking system.

Another subject-matter of the present invention is a tyre comprising at least one piezoelectric device defined above. Another subject-matter of the present invention is the use of a piezoelectric composite material defined above in the manufacture of structural parts and of supported films deposited over all or part of the surface of such a support.

Another subject-matter of the present invention relates to a process for the manufacture of structural parts and of supported films in which at least one piezoelectric composite material defined above is deposited over all or part of a support.

The composite material of the invention exhibits the advantage of having improved piezoelectric properties in comparison with the composite materials of the prior art at isopolarization conditions. This makes it possible, for example, to improve the viability of the composite material or else to use piezoelectric composite materials of smaller size for delivering the same electrical intensity, and thus to reduce the production costs or to miniaturize the devices in which the piezoelectric composite material is used. Due to these improved piezoelectric properties, it is also possible to modulate the stage of polarization of the piezoelectric composite material of the invention in order to obtain the same properties as a composite material of the prior art, for example by reducing the duration of polarization or else by reducing the electric force of the electric field.

FIG. 1 is a representation of the system of orthogonal axes for the polarization, P, and the stress. The indices 1, 2, 3 respectively correspond to the directions normal to the planes YOZ, XOZ and XOY, and the indices 4, 5, 6 to the directions tangential to these same planes.

The invention relates to a piezoelectric composite material based on a polymeric matrix and on piezoelectric inorganic fillers, characterized in that said material additionally comprises at least one ionic liquid of general formula $Q^+A^-$, in which $Q^+$ represents a cation chosen from quaternary ammonium cations and quaternary phosphonium cations and $A^-$ represents any anion capable of forming a liquid salt at a temperature of less than 100° C.

In the present description, any interval of values denoted by the expression "from a to b" represents the range of values extending from a up to b (that is to say, limits a and b included). Any interval "between a and b" represents the range of values extending from more than a to less than b (that is to say, limits a and b excluded).

The term "piezoelectric composite material" is understood to mean a material based on at least one piezoelectric material, which gives the composite material its piezoelectric activity, and based on one or more non-piezoelectric phases. This combination results in a piezoelectric composite material having enhanced performance qualities in comparison with each phase alone.

The expression "piezoelectric composite material based on" should be understood as meaning a piezoelectric composite material comprising the mixture and/or the product of the in situ reaction of the various base constituents used, some of these constituents being able to react and/or being intended to react with one another, at least partially, during the various phases of manufacture of said composite or, if appropriate, during the subsequent curing, modifying said composite as it is prepared at the start. Thus, the piezoelectric composite materials as employed for the invention can be different, for example, if appropriate, in the non-crosslinked state and in the crosslinked state.

The expression "consists essentially of", followed by one or more characteristics, means that, besides the components or stages explicitly listed, components or stages which do not significantly modify the properties and the characteristics of the invention can be included in the process or the material of the invention.

The compounds mentioned in the description and participating in the preparation of rubber compositions or polymers can be of fossil origin or biobased. In the latter case, they can partially or completely result from biomass or be obtained from renewable starting materials resulting from biomass. Polymers, fillers and the like are concerned in particular.

The piezoelectric composite material of the invention comprises a polymeric matrix, that is to say a polymer or a mixture of polymers.

The term "polymeric matrix" is understood to mean the polymer or all of the polymers which constitute(s) the non-piezoelectric phase of the piezoelectric composite material.

Advantageously, the polymeric matrix comprises at least one polymer selected from the group consisting of thermosetting polymers, thermoplastic polymers, elastomers and the mixtures of these polymers.

Advantageously, the matrix of the piezoelectric composite material of the invention comprises at least one thermoplastic elastomer and/or one diene elastomer.

The choice of the nature of the polymer(s) for constituting the matrix will depend on the use of the device into which the piezoelectric composite material of the invention will be inserted. For example, when this device will be used to replace conventional batteries of limited duration, it will be preferable to use a rigid polymeric matrix, thus, for example, based on at least one thermosetting polymer or else on a thermoplastic polymer. On the other hand, when it is desired to use a device in a tyre, a flexible matrix based on diene or thermoplastic elastomers, in particular diene elastomers, will be preferred.

Preferentially, the thermosetting polymers can be chosen from polyurethanes, phenol/formaldehyde resins, urea/formaldehyde resins, melamine resins, diallyl phthalates, epoxy resins, polyimides, and polyester resins. Mention may be made, among the polyurethanes, of anionic, cationic, non-ionic or amphoteric polyurethanes, polyurethane/acrylics, polyurethane/polyvinylpyrrolidones, polyester/polyurethanes, polyether/polyurethanes, polyureas, polyurea/polyurethanes, polyurethane silicones and their mixtures.

Preferentially, the thermoplastic polymers which can be used in the context of the present invention can be any polymer, copolymer or any mixture of polymers and/or copolymers having the property of being thermoplastic. Mention may in particular be made, among the thermoplastic polymers, of low-density polyethylene (LDPE), polypropylene (PP), polystyrene (PS), polymethyl methacrylate (PMMA), aliphatic polyamides and polyesters. Mention may in particular be made, among the aliphatic polyamides, of the polyamides PA-4,6, PA-6, PA-6,6, PA-11 or PA-12. Mention may be made, among the polyesters, for example, of PET (polyethylene terephthalate), PEN (polyethylene naphthalate), PBT (polybutylene terephthalate), PBN (polybutylene naphthalate), PPT (polypropylene terephthalate) and PPN (polypropylene naphthalate).

Use may also preferentially be made, among the thermoplastic polymers which can be used in the context of the present invention, of thermoplastic elastomers. Thermoplastic elastomers (abbreviated to "TPEs") have a structure intermediate between thermoplastic polymers and elastomers. They are block copolymers consisting of rigid thermoplastic blocks connected by flexible elastomer blocks.

The thermoplastic elastomer used for the implementation of the invention can be a block copolymer, the chemical nature of the thermoplastic blocks and elastomer blocks of which can vary.

In a known way, TPEs exhibit two glass transition temperature (Tg, measured according to ASTM D3418-1999) peaks, the lowest temperature being relative to the elastomer part of the TPE and the highest temperature being relative to the thermoplastic part of the TPE. Thus, the flexible blocks of the TPEs are defined by a Tg which is less than ambient temperature (25° C.), while the rigid blocks have a Tg of greater than 80° C.

In order to be both elastomeric and thermoplastic in nature, the TPE has to be provided with blocks which are sufficiently incompatible (that is to say, different as a result of their respective masses, of their respective polarities or of their respective Tg values) to retain their own properties of elastomer or thermoplastic block.

The TPEs can be copolymers with a small number of blocks (less than 5, typically 2 or 3), in which case these blocks preferably have high masses of greater than 15 000 g/mol. These TPEs can, for example, be diblock copolymers, comprising a thermoplastic block and an elastomer block. These are often also triblock elastomers with two rigid segments connected by a flexible segment. The rigid and flexible segments can be positioned linearly, in a star-branched or branched configuration. Typically, each of these segments or blocks often contains a minimum of more than 5, generally of more than 10, base units (for example, styrene units and butadiene units for a styrene/butadiene/styrene block copolymer).

The TPEs can also comprise a large number of smaller blocks (more than 30, typically from 50 to 500), in which case these blocks preferably have relatively low masses, for example from 500 to 5000 g/mol; these TPEs will be referred to subsequently as multiblock TPEs and are an elastomer block/thermoplastic block sequence.

The elastomer blocks of the TPE for the requirements of the invention can be all the elastomers known to a person skilled in the art. They preferably have a Tg of less than 25° C., preferentially of less than 10° C., more preferentially of less than 0° C. and very preferentially of less than −10° C. Also preferentially, the elastomer block Tg of the TPE is greater than −100° C.

Use will be made, for the definition of the thermoplastic blocks, of the characteristic of glass transition temperature (Tg) of the rigid thermoplastic block. This characteristic is well known to a person skilled in the art. It makes it possible in particular to choose the industrial processing (transformation) temperature. In the case of an amorphous polymer (or polymer block), the processing temperature is chosen to be substantially greater than the Tg. In the specific case of a semi-crystalline polymer (or polymer block), a melting point may be observed which is then greater than the glass transition temperature. In this case, it is instead the melting point (M.p.) which makes it possible to choose the processing temperature for the polymer (or polymer block) under consideration. Thus, subsequently, when reference is made to "Tg (or M.p., if appropriate)", it should be considered that this is the temperature used to choose the processing temperature.

For the requirements of the invention, the TPE elastomers comprise one or more thermoplastic block(s) preferably having a Tg (or M.p., if appropriate) of greater than or equal to 80° C. and formed from polymerized monomers. Preferentially, this thermoplastic block has a Tg (or M.p., if appropriate) within a range varying from 80° C. to 250° C.

Preferably, the Tg (or M.p., if appropriate) of this thermoplastic block is preferentially from 80° C. to 200° C., more preferentially from 80° C. to 180° C.

The proportion of the thermoplastic blocks, with respect to the TPE as defined for the implementation of the invention, is determined, on the one hand, by the thermoplasticity properties which said copolymer has to exhibit. The thermoplastic blocks having a Tg (or M.p., if appropriate) of greater than or equal to 80° C. are preferentially present in proportions sufficient to retain the thermoplastic nature of the elastomer according to the invention. The minimum content of thermoplastic blocks having a Tg (or M.p., if appropriate) of greater than or equal to 80° C. in the TPE can vary as a function of the conditions of use of the copolymer. On the other hand, the ability of the TPE to deform can also contribute to determining the proportion of the thermoplastic blocks having a Tg (or M.p., if appropriate) of greater than or equal to 80° C.

By way of example, use may be made, for the polymeric matrix of the piezoelectric material of the invention, of any TPE which is a copolymer, the elastomer part of which is saturated and which comprises styrene blocks and alkylene blocks. The alkylene blocks are preferentially of ethylene, propylene or butylene. More preferentially, this TPE elastomer is selected from the following group consisting of diblock copolymers and linear or star-branched triblock copolymers: styrene/ethylene/butylene (SEB), styrene/ethylene/propylene (SEP), styrene/ethylene/ethylene/propylene (SEEP), styrene/ethylene/butylene/styrene (SEBS), styrene/ethylene/propylene/styrene (SEPS), styrene/ethylene/ethylene/propylene/styrene (SEEPS), styrene/isobutylene (SIB), styrene/isobutylene/styrene (SIBS) and the mixtures of these copolymers.

According to another example, use may be made, for the polymeric matrix of the piezoelectric material of the invention, of any TPE which is a copolymer, the elastomer part of which is unsaturated and which comprises styrene blocks and diene blocks, these diene blocks being in particular isoprene or butadiene blocks. More preferentially, this TPE elastomer is selected from the following group consisting of diblock copolymers and linear or star-branched triblock copolymers: styrene/butadiene (SB), styrene/isoprene (SI), styrene/butadiene/isoprene (SBI), styrene/butadiene/styrene (SBS), styrene/isoprene/styrene (SIS), styrene/butadiene/isoprene/styrene (SBIS) and the mixtures of these copolymers.

For example again, the TPE used can be a linear or star-branched copolymer, the elastomer part of which comprises a saturated part and an unsaturated part, such as, for example, styrene/butadiene/butylene (SBB), styrene/butadiene/butylene/styrene (SBBS) or a mixture of these copolymers.

Use may be made, among multiblock TPEs, of the copolymers comprising random copolymer blocks of ethylene and propylene/polypropylene, polybutadiene/polyurethane (TPU), polyether/polyester (COPE) or polyether/polyamide (PEBA).

It is also possible for the TPEs given as example above to be mixed with one another within the TPE matrix according to the invention.

Mention may be made, as examples of commercially available TPE elastomers, of the elastomers of SEPS, SEEPS or SEBS type sold by Kraton under the name Kraton G (G1650, G1651, G1654 and G1730 products) or Kuraray under the name Septon (Septon 2007, Septon 4033 or Septon 8004), or the elastomers of SIS type sold by Kuraray under the name Hybrar 5125 or sold by Kraton under the name D1161, or also the elastomers of linear SBS type sold by Polimeri Europa under the name Europrene SOL T 166 or of star-branched SBS type sold by Kraton under the name D1184. Mention may also be made of the elastomers sold by Dexco Polymers under the name Vector (Vector 4114 or Vector 8508). Mention may be made, among the multiblock TPEs, of the Vistamaxx TPE sold by Exxon; of the COPE TPE sold by DSM under the name Arnitel or by DuPont under the name Hytrel or by Ticona under the name Riteflex; of the PEBA TPE sold by Arkema under the name PEBAX; or of the TPU TPE sold by Sartomer under the name TPU 7840 or by BASF under the name Elastogran.

Preferentially, the polymeric matrix comprises at least one diene elastomer.

"Diene elastomer (or, without distinction, rubber)", whether natural or synthetic, should be understood, in a known way, as meaning an elastomer composed, at least in part (i.e., a homopolymer or a copolymer), of diene monomer units (monomers bearing two conjugated or non-conjugated carbon-carbon double bonds).

These diene elastomers can be classified into two categories: "essentially unsaturated" or "essentially saturated". The term "essentially unsaturated" is understood to mean generally a diene elastomer resulting at least in part from conjugated diene monomers having a content of units of diene origin (conjugated dienes) which is greater than 15% (mol %); thus it is that diene elastomers such as butyl rubbers or copolymers of dienes and of α-olefins of EPDM type do not come within the preceding definition and can in particular be described as "essentially saturated" diene elastomers (low or very low content, always less than 15 mol %, of units of diene origin).

The following are suitable as diene elastomer capable of being used in the polymeric matrices of the piezoelectric composite material in accordance with the invention:
  any homopolymer of a conjugated or non-conjugated diene monomer having from 4 to 18 carbon atoms;
  any copolymer of a conjugated or non-conjugated diene having from 4 to 18 carbon atoms and of at least one other monomer.

The other monomer of the copolymer of a diene can be ethylene, an olefin or a conjugated or non-conjugated diene.

Suitable as conjugated dienes are conjugated dienes having from 4 to 12 carbon atoms, especially 1,3-dienes, such as, in particular, 1,3-butadiene and isoprene.

Suitable as non-conjugated dienes are non-conjugated dienes having from 6 to 12 carbon atoms, such as 1,4-hexadiene, ethylidenenorbornene or dicyclopentadiene.

Suitable as olefins are vinylaromatic compounds having from 8 to 20 carbon atoms and aliphatic α-monoolefins having from 3 to 12 carbon atoms.

Suitable as vinylaromatic compounds are, for example, styrene, ortho-, meta- or para-methylstyrene, the "vinyltoluene" commercial mixture or para-(tert-butyl)styrene.

Suitable as aliphatic α-monoolefins are in particular acyclic aliphatic α-monoolefins having from 3 to 18 carbon atoms.

More particularly, the diene elastomer is:
  any homopolymer of a conjugated diene monomer, in particular any homopolymer obtained by polymerization of a conjugated diene monomer having from 4 to 12 carbon atoms;
  any copolymer obtained by copolymerization of one or more conjugated dienes with one another or with one or more vinylaromatic compounds having from 8 to 20 carbon atoms;

any copolymer obtained by copolymerization of one or more conjugated or non-conjugated dienes with ethylene, an α-monoolefin or their mixture, such as, for example, the elastomers obtained from ethylene, from propylene with a non-conjugated diene monomer of the abovementioned type.

Preferentially, the diene elastomer is selected from the group consisting of natural rubber (NR), copolymers of dienes and of α-olefins, synthetic polyisoprenes (IRs), polybutadienes (BRs), butadiene copolymers, isoprene copolymers and the mixtures of these diene elastomers. Mention will in particular be made, among the isoprene copolymers, of isobutene/isoprene (butyl rubber—IIR), isoprene/styrene (SIR), isoprene/butadiene (BIR) or isoprene/butadiene/styrene (SBIR) copolymers. Mention will in particular be made, among the butadiene copolymers, of butadiene/styrene (SBR), isoprene/butadiene (BIR) or isoprene/butadiene/styrene (SBIR) copolymers. Ethylene/propylene/diene monomer (EPDM) copolymers are the preferred among the copolymers of dienes and of α-olefins.

More preferentially still, the diene elastomer is selected from the group consisting of natural rubber, ethylene/propylene/diene monomer copolymers, synthetic polyisoprenes, polybutadienes, styrene/butadiene copolymers, isoprene/styrene copolymers, isoprene/butadiene/styrene copolymers, isoprene/butadiene copolymers and the mixtures of these diene elastomers.

More preferentially still, the diene elastomer is a styrene/butadiene copolymer. Suitable in particular are butadiene/styrene copolymers and in particular those having a Tg (glass transition temperature (Tg, measured according to ASTM D3418-1999) of between 0° C. and −90° C. and more particularly between −10° C. and −70° C., a styrene content of between 1% and 60% by weight and more particularly between 20% and 50%, a content (mol %) of 1,2-bonds of the butadiene part of between 4% and 75% and a content (mol %) of trans-1,4-bonds of between 10% and 80%.

The diene elastomer can be modified, that is to say either coupled and/or star-branched, or functionalized, or coupled and/or star-branched and simultaneously functionalized.

Thus, the diene elastomer can be coupled and/or star-branched, for example by means of a silicon or tin atom which connects the elastomer chains together.

The diene elastomer can be simultaneously or alternatively functionalized and comprise at least one functional group. The term "functional group" is understood to mean a group comprising at least one heteroatom chosen from Si, N, S, O or P. Particularly suitable as functional groups are those comprising at least one function, such as: silanol, an alkoxysilane, a primary, secondary or tertiary amine which is cyclic or non-cyclic, a thiol or an epoxide.

In the context of functionalized elastomers, that is to say elastomers comprising at least one functional group:
  The functional group can be located at the end of the elastomer chain; it will then be said that the diene elastomer is functionalized at the chain end.
  The functional group can be located in the main linear elastomer chain; it will then be said that the diene elastomer is coupled or also functionalized in the middle of the chain, in contrast to the position "at the chain end", although the group is not located precisely in the middle of the main elastomer chain.
  The functional group can be central and connect n elastomer chains (n>2), the elastomer being star-branched or branched.

The diene elastomer can comprise several functional groups, which are or are not pendant, distributed along the main chain of the elastomer; it will then be said that the diene elastomer is functionalized along the chain.

The polymeric matrix can contain just one elastomer, in particular a diene elastomer, or a mixture of several elastomers, in particular diene and/or thermoplastic elastomers.

According to one embodiment of the invention, if several polymers are used in the polymeric matrix of the piezoelectric composite material of the invention, the diene elastomer(s) constitute the predominant fraction by weight; they then represent more than 50% by weight, more preferentially at least 75% by weight, with respect to the total weight of the polymers in the rubber composition. Preferentially again, the diene elastomer(s) represent at least 90%, indeed even 95% (in particular 100%), by weight, with respect to the total weight of the polymers in the rubber composition.

Preferentially, the polymeric matrix comprises from 75 to 100 parts by weight of diene elastomer, with respect to 100 parts by weight of polymers, more advantageously from 90 to 100 parts by weight of diene elastomer, with respect to 100 parts by weight of polymers, more advantageously still from 95 to 100 parts by weight of diene elastomer, with respect to 100 parts by weight of polymers. In a preferred alternative form of the invention, the diene elastomer or the mixture of diene elastomers is the only elastomer of the polymeric matrix.

The piezoelectric composite material of the invention is also based on at least one piezoelectric inorganic filler. These piezoelectric inorganic fillers can be advantageously dispersed in the polymeric matrix, advantageously in the form of particles not bonded to the polymeric matrix.

The term "particles not bonded to the polymeric matrix" is understood to mean particles without covalent bonds between the piezoelectric inorganic filler and the constituent polymer(s) of the polymeric matrix of the piezoelectric composite material.

The term "particles dispersed in the polymeric matrix" is understood to mean that the piezoelectric inorganic filler used in the context of the present invention is distributed substantially uniformly in the polymeric matrix of the piezoelectric composite material. Thus, the mean distance separating the adjacent particles of these fillers is substantially constant throughout the entire volume of said polymeric matrix.

These piezoelectric inorganic fillers can be piezoelectric single crystals or piezoelectric ceramics.

The piezoelectric single crystals are in particular natural piezoelectric materials, such as quartz or tourmaline. These ferroelectric crystals can have a domain structure. Monodomain single crystals and polydomain single crystals can be distinguished according to whether one or more polarization directions coexist in the crystal.

Advantageously, the piezoelectric inorganic filler used in the context of the invention can be chosen from piezoelectric ceramics.

Piezoelectric ceramics are materials with strong electromechanical coupling and high density. These ceramics derive their piezoelectric property from their crystalline structure, through the absence of symmetry of the crystal unit cell, which splits up the centres of gravity of the positive and negative charges, each unit cell then constituting an electric dipole. The crystal unit cell thus has a permanent dipole which gives these ceramics high dielectric permittivity values. Synthetic piezoelectric ceramics are in particular composed of ferroelectric oxides, which have the property of possessing a spontaneous electric polarization, which can furthermore be reversed by the application of a sufficiently intense external electric field.

Advantageously, the piezoelectric inorganic filler can be chosen from ferroelectric oxides.

The ferroelectric oxides can in particular be endowed with a perovskite structure. They advantageously correspond to a general formula $ABO_3$, such as barium titanate ($BaTiO_3$), lead titanate ($PbTiO_3$), potassium niobate ($KNbO_3$), lead niobate ($PbNbO_3$) or bismuth ferrite ($BiFeO_3$). In this family of piezoelectric materials, mention may also be made of lead zirconate titanate (PZT) with a $Pb(Zr_xTi_{1-x})O_3$ structure in which x is between 0 and 1. It can be in pure form or in the form of a semiconductor doped either with acceptor dopants (to give a "hard" PZT), such as Fe, Co, Mn, Mg, Al, In, Cr, Sc, Na or K, or with donor dopants (to give a "soft" PZT), such as La, Nd, Sb, Ta, Nb or W.

Advantageously, the piezoelectric inorganic fillers which can be used in the context of the invention have a perovskite structure.

By way of nonlimiting examples, the piezoelectric inorganic filler which can be used in the context of the invention can be selected from the group consisting of barium titanate, lead titanate, lead zirconate titanate (PZT), lead niobate, lithium niobate, potassium niobate and their mixtures.

The most well-known piezoelectric ceramics are barium titanate ($BaTiO_3$) and lead zirconate titanate (PZT), which have a very good electromechanical coefficient and offer a variety of manufacturing processes. The latter (sol-gel process, hydrothermal synthesis, calcination, and the like) make it possible to modify the dielectric, mechanical and piezoelectric properties depending on the application targeted. Both barium titanate and potassium niobate are lead-free piezoelectric materials. They have the advantage of being less toxic.

Advantageously, the piezoelectric inorganic filler can be chosen from barium titanate, potassium niobate, lead zirconate titanate and their mixtures. More preferentially still, the piezoelectric inorganic filler is chosen from barium titanate, potassium niobate and their mixtures.

In particular, the piezoelectric inorganic fillers have particle sizes of between 50 nm and 800 μm. The size of the particles corresponds to the average diameter of the particles. The average diameter is measured by scanning electron microscopy (SEM) analysis. Photographs are taken on powder samples. Image analysis is carried out using software and makes it possible to attain the average diameter of the particles present.

The volume of piezoelectric inorganic fillers used in the material of the invention will depend on the use of said material.

Preferentially, the content of piezoelectric inorganic filler in the composite material of the invention is greater than or equal to 5% by volume, in particular greater than or equal to 6% by volume, more preferentially still greater than or equal to 7% by volume, with respect to the total volume of the piezoelectric composite material.

More preferentially still, the content of piezoelectric inorganic filler is within a range extending from 5% to 80% by volume, with respect to the total volume of the piezoelectric composite material, advantageously within a range from 6% to 60% by volume, more advantageously still from 7% to 50% by volume.

The piezoelectric composite material of the invention comprises at least one ionic liquid.

The term "ionic liquid" is understood to mean, within the meaning of the present invention, a non-aqueous ionized solvent which is liquid at a temperature of less than 100° C., that is to say a non-aqueous liquid substance for a temperature of less than 100° C. (at atmospheric pressure) characterized by a dissociation of the neutral entities into various cations and anions.

Ionic liquids (referred to as "Room Temperature Ionic Liquid" or "RTIL") are thus highly ionized molten non-aqueous salts which in particular exhibit a melting point of less than or equal to 150° C., preferably of less than 100° C. The melting point is measured by differential scanning calorimetry, with a rate of temperature rise of 10° C./minute; the melting point is then at a temperature corresponding to the top of the endothermic melting peak obtained during the measurement.

Ionic liquids should not be confused with salts, typically NaCl, $NH_4Cl$, $MgSO_4$, and the like, which are often solid at ambient temperature and dissolve in a solvent, in particular in an aqueous solvent, such as water. Ionic liquids have been described in more detail in the following documents: "Ionic Liquids, Physicochemical Properties", Suojiang Zhang, Xingmei Lu, Qing Zhou, Xiaohua Li, Xiangping Zhang and Shucai Li, Elsevier Science (2009); "Ionic Liquids 'in a Nutshell' (History, Properties and Development)", Pernak J., Rzemieniecki T. and Materna K., Chemik, 70(9), 471-480 (2016); and in "An Introduction to Ionic Liquids", Freemantle, M., Royal Society of Chemistry; 1st edition (2010).

The ionic liquid can thus result from the association of an inorganic or organic anion and an inorganic or organic cation. Preferably, an organic molecule constitutes the cation of the ionic liquid and the anion of the ionic liquid can be inorganic or organic.

The ionic liquid used in the context of the present invention is an ionic liquid of general formula $Q^+A^-$, in which $Q^+$ represents a cation chosen from quaternary ammonium cations or quaternary phosphonium cations and A-represents any anion capable of forming a liquid salt at a temperature of less than or equal to 100° C. and advantageously of less than or equal to 85° C., more preferentially still of less than or equal to 50° C.

The quaternary ammonium cations and the quaternary phosphonium cations $Q^+$ preferably correspond to the general formulae $N+R^aR^bR^cR^d$ and $P^+R^aR^bR^cR^d$ or to the general formulae $R^aR^bN+=CR^cR^d$ and $R^aR^bP^+=CR^cR^d$, where $R^a$, $R^b$, $R^c$ and $R^d$, which are identical or different, represent a hydrogen atom (with the exception of the $NH_4^+$ cation for $N^+R^aR^bR^cR^d$, preferably a single $R^a$, $R^b$, $R^c$ and $R^d$ substituent represents hydrogen) or hydrocarbyl radicals having from 1 to 30 carbon atoms. These hydrocarbyl radicals can be, for example, $C_1$-$C_{30}$ alkyls, which are saturated or unsaturated, $C_3$-$C_{30}$ cycloalkyls or $C_5$-$C_{30}$ aromatic rings. These hydrocarbyl radicals may or may not be substituted.

The $R^a$, $R^b$, $R^c$ and $R^d$ substituents can also form a nitrogen-containing and/or phosphorus-containing heterocyclic ring comprising 1, 2 or 3 nitrogen and/or phosphorus atoms, of general formulae.

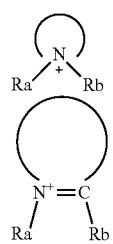

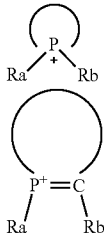

in which the rings consist of 4 to 10 atoms, preferably of 5 to 6 atoms; $R^a$ and $R^b$ are defined as above.

Preferentially, the ionic liquid(s) used in the context of the present invention have a quaternary ammonium cation $Q^+$ selected from the group consisting of imidazolium cations, pyrazolium cations, pyridinium cations, pyrimidinium cations, tetra($C_1$-$C_6$)alkylammonium cations, guanidium cations and pyrrolidium cations.

The imidazolium cations preferentially correspond to the following general formula (I):

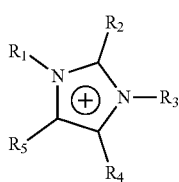

in which:
R₁ represents an alkyl group comprising from 1 to 15 carbon atoms, preferably from 1 to 10 carbon atoms, optionally substituted by one or more $C_6$-$C_{30}$ aryl, thiol or hydroxyl groups or interrupted by one or more oxygen or sulfur atoms or by one or more NR' groups,
$R_2$, $R_3$, $R_4$, $R_5$ and R', which are identical or different, each represent a hydrogen atom or an alkyl group comprising from 1 to 10 carbon atoms, preferably from 1 to 5 carbon atoms, or a $C_6$-$C_{30}$ aryl group, optionally substituted with one or more $C_1$-$C_4$ alkyl groups.

More preferentially still, in the formula (I), $R_1$ represents an alkyl group comprising from 1 to 10 carbon atoms and $R_2$, $R_3$, $R_4$ and $R_5$, which are identical or different, each represent a hydrogen atom or an alkyl group comprising from 1 to 10 carbon atoms, preferably from 1 to 5 carbon atoms.

More preferentially still, in the formula (I), $R_1$ represents an alkyl group comprising from 1 to 10 carbon atoms, $R_2$ and $R_3$, which are identical or different, each represent a hydrogen atom or an alkyl group comprising from 1 to 10 carbon atoms, preferably from 1 to 5 carbon atoms, and $R_4$ and $R_5$ represent a hydrogen atom.

The imidazolium cations of general formula (I), which are more particularly preferred, are chosen from 1-ethyl-3-methylimidazolium, 1-butyl-3-methylimidazolium, 1-hexyl-m-methylimidazolium, 1-octyl-3-methylimidazolium, 1-decyl-3-methylimidazolium, 1,3-dibutylimidazolium and 1-butyl-2,3-dimethylimidazolium.

The ionic liquid(s) have an anion $A^-$ capable of forming a liquid salt at a temperature of less than or equal to 100° C., advantageously of less than or equal to 85° C. and more preferentially still of less than or equal to 50° C. This anion can be an inorganic anion or an organic anion.

More preferentially, the anion $A^-$ can be selected from the group consisting of chloride ($Cl^-$) anions, bromide ($Br^-$) anions, tetrachloroaluminate ($AlCl_4^-$) anions, tetrachloronickel ($NiCl_4^-$) anions, perchlorate ($ClO_4^-$) anions, nitrate ($NO_3^-$) anions, nitrite ($NO_2$) anions, sulfate ($SO_4^-$) anions, methylsulfate ($CH_3SO_4$) anions, tetrafluoroborate ($BF_4$) anions, phosphate ($PO_4^{3-}$) anions, hexafluorophosphate ($PF^-$) anions, dibutyl phosphate anions and tris(pentafluoroethyl)trifluorophosphate anions, hexafluoroantimonate ($SbF^-$) anions, triflate [TfO] ($CF_3SO_2^-$) anions, nonaflate [NfO] ($CF_3(CF_2)_3SO_2$) anions, bis(trifyl)amide [Tf2N] ($CF_3SO_2)_2N^-$) anions, trifluoroacetate [TA] ($CF_3CO_2$) anions, heptafluorobutanoate [HB]($CF_3(CF_2)_3CO_2$) anions, acetate ($CH_3CO_2$) anions, trifluoroacetate ($CF_3CO_2$) anions, trifluoromethanesulfonate ($CF_3SO_3$) anions, dicyanamide anions, hydroxide ($OH^-$) anions, salicylate anions, L-(+)-lactate anions, propionate ($CH_3CH_2CO_2$) anions and pentafluoromethanesulfonate anions.

More preferentially still, the anion $A^-$ is selected from the group consisting of acetate, trifluoroacetate, propionate, chloride, hydroxide, sulfate, trifluoromethanesulfonate, pentafluoromethanesulfonate and phosphates; preferably, the anion $A^-$ is acetate or propionate.

More preferentially still, the ionic liquid is of formula $Q^+A^-$ in which $Q^+$ is selected from the group consisting of imidazolium cations, pyrazolium cations, pyridinium cations, pyrimidinium cations, tetra($C_1$-$C_6$)alkylammonium cations, guanidium cations and pyrrolidium cations and $A^-$ is selected from the group formed by acetate, trifluoroacetate, propionate, chloride, hydroxide, sulfate, trifluoromethanesulfonate, pentafluoromethanesulfonate and phosphates.

More preferentially still, the ionic liquid is of formula $Q^+A^-$ in which $Q^+$ is chosen from imidazolium cations, preferably the imidazolium cations of formula (I), and $A^-$ is selected from the group formed by acetate, trifluoroacetate and propionate.

In a non-exhaustive manner, the ionic liquid(s) used according to the invention can be chosen from the following compounds: 1-ethyl-3-methylimidazolium chloride, 1-ethyl-3-methylimidazolium bromide, 1-butyl-3-methylimidazolium chloride, 1-hexyl-3-methylimidazolium chloride, 1-methyl-3-octylimidazolium chloride, 1-decyl-3-methylimidazolium chloride, 1-decyl-3-methylimidazolium bromide, 1-dodecyl-3-methylimidazolium chloride, 1-methyl-3-tetradecylimidazolium chloride, 1-ethyl-3-methylimidazolium tetrafluoroborate, 1-butyl-3-methylimidazolium tetrafluoroborate, 1-pentyl-3-methylimidazolium tetrafluoroborate, 1-hexyl-3-methylimidazolium tetrafluoroborate, 1-heptyl-3-methylimidazolium tetrafluoroborate, 1-octyl-3-methylimidazolium tetrafluoroborate, 1-nonyl-3-methylimidazolium tetrafluoroborate, 1-decyl-3-methylimidazolium tetrafluoroborate, 1-hexyl-3-ethylimidazolium tetrafluoroborate, 1-ethyl-3-methylimidazolium hexafluorophosphate, 1-butyl-3-methylimidazolium hexafluorophosphate, 1-pentyl-3-methylimidazolium hexafluorophosphate, 1-hexyl-3-methylimidazolium hexafluorophosphate, 1-heptyl-3-methylimidazolium hexafluorophosphate, 1-octyl-3-methylimidazolium hexafluorophosphate, 1-nonyl-3-methylimidazoliumhexafluorophosphate, 1-decyl-3-methylimidazolium hexafluorophosphate, 1,3-dimethylimidazolium methyl sulfate, 1-methyl-3-butylimidazoliummethyl sulfate, 1-ethyl-3-methylimidazolium nitrate, 1-ethyl-3-methylimidazolium nitrite, 1-ethyl-3-methylimidazolium acetate, 1-ethyl-3-methylimidazolium sulfate, 1-ethyl-3-methylimidazolium triflates, 1-ethyl-3-methylimidazolium nonaflates, 1-ethyl-3- methylimidazolium bis(trifyl)amide, trihexyltetradecylphosphonium chloride, tributyltetradecylphosphonium chloride, 1-ethyl-3-methylimidazolium trifluoroacetate, 1-hexyl-2,3-dimethylimidazolium chloride, 1-ethyl-2,3-dimethylimidazolium chloride, 1-ethyl-3-methylimidazolium dicyanamide, 1-butyl-3-methylimidazolium dicyanamide, 1-ethyl-3-methylimidazolium methylphosphonate and 1-butyl-3-methylimidazolium acetate.

More preferentially still, the ionic liquid is of formula $Q^+A^-$ in which $Q^+$ is selected from the group formed by 1-ethyl-3-methylimidazolium, 1-butyl-3-methylimidazolium, 1-hexyl-m-methylimidazolium, 1-octyl-3-methylimidazolium, 1-decyl-3-methylimidazolium, 1,3-dibutylimidazolium and 1-butyl-2,3-dimethylimidazolium and $A^-$ is selected from the group formed by acetate, trifluoroacetate, propionate, chloride, hydroxide, sulfate, trifluoromethanesulfonate, pentafluoromethanesulfonate and phosphates.

More preferentially still, the ionic liquid is chosen from 1-ethyl-3-methylimidazolium trifluoroacetate, 1-butyl-3-methylimidazolium acetate, 1-ethyl-3-methylimidazolium acetate or 1-butyl-3-methylimidazolium trifluoroacetate.

A person skilled in the art knows how to adapt the content of ionic liquid in the piezoelectric composite material of the invention as a function of the electric force of the electric field used during the phase of polarization of said composite material.

Preferably, the content of ionic liquid in the piezoelectric composite material is greater than or equal to 0.1 part by weight per hundred parts by weight of polymer, preferably is within a range extending from 0.1 to 15 parts by weight per hundred parts by weight of polymer, more preferentially from 0.5 to 12 parts by weight per hundred parts by weight of polymer, more preferentially still from 1 to 10 parts by weight per hundred parts by weight of polymer.

Ionic liquids are commercially available from suppliers such as Sigma-Aldrich.

When the polymeric matrix comprises at least one elastomer, in particular a thermoplastic and/or diene elastomer, the crosslinking system can be any type of known system. It can in particular be based on sulfur, and/or on peroxide and/or on bismaleimides.

According to a preferred embodiment, the crosslinking system is based on sulfur; it is then called a vulcanization system. The sulfur can be contributed in any form, in particular in the form of molecular sulfur or of a sulfur-donating agent. At least one vulcanization accelerator is also preferentially present and, optionally, also preferentially, use may be made of various known vulcanization activators, such as zinc oxide, stearic acid or any equivalent compound, such as salts of stearic acid and salts of transition metals, guanidine derivatives (in particular diphenylguanidine), or also known vulcanization retarders.

When it is present, the sulfur is used at a preferential content of between 0.5 and 12 parts by weight per hundred parts by weight of polymer, in particular between 1 and 10 parts by weight per hundred parts by weight of polymer. The vulcanization accelerator is used at a preferential content of between 0.5 and 10 parts by weight per hundred parts by weight of polymer, more preferentially of between 0.5 and 5.0 parts by weight per hundred parts by weight of polymer.

Use may be made, as accelerator, of any compound capable of acting as accelerator of the vulcanization of diene elastomers in the presence of sulfur, in particular accelerators of the thiazole type, and also their derivatives, or accelerators of sulfenamide, thiuram, dithiocarbamate, dithiophosphate, thiourea and xanthate types. Mention may in particular be made, as examples of such accelerators, of the following compounds: 2-mercaptobenzothiazyl disulfide (abbreviated to "MBTS"), N-cyclohexyl-2-benzothiazole-sulfenamide ("CBS"), N,N-dicyclohexyl-2-benzothiazole-sulfenamide ("DCBS"), N-(tert-butyl)-2-benzothiazole-sulfenamide ("TBBS"), N-(tert-butyl)-2-benzothiazolesulfenimide ("TBSI"), tetrabenzylthiuram disulfide ("TBZTD"), zinc dibenzyldithiocarbamate ("ZBEC") and the mixtures of these compounds.

According to another preferential embodiment, the crosslinking system preferentially contains a peroxide. Advantageously, the peroxide is the only crosslinking agent. Thus, advantageously, according to this embodiment, the composition does not comprise a vulcanization system, that is to say a sulfur-based crosslinking system.

The peroxide which can be used in the context of the invention can be any peroxide known to a person skilled in the art.

Preferably, the peroxide is chosen from organic peroxides.

The term "organic peroxide" is understood to mean an organic compound, that is to say a compound containing carbon, comprising an —O—O— group (two oxygen atoms connected by a single covalent bond).

During the crosslinking process, the organic peroxide decomposes at its unstable O—O bond to give free radicals. These free radicals make possible the creation of the crosslinking bonds.

According to one embodiment, the organic peroxide is selected from the group consisting of dialkyl peroxides, monoperoxycarbonates, diacyl peroxides, peroxyketals, peroxyesters and their mixtures.

Preferably, the dialkyl peroxides are selected from the group consisting of dicumyl peroxide, di(t-butyl) peroxide, t-butyl cumyl peroxide, 2,5-dimethyl-2,5-di(t-butylperoxy)hexane, 2,5-dimethyl-2,5-di(t-amylperoxy)hexane, 2,5-dimethyl-2,5-di(t-butylperoxy)hex-3-yne, 2,5-dimethyl-2,5-di(t-amylperoxy)hex-3-yne, α,α'-di[(t-butylperoxy)isopropyl]benzene, α,α'-di[(t-amylperoxy)isopropyl]benzene, di(t-amyl) peroxide, 1,3,5-tri[(t-butylperoxy)isopropyl]benzene, 1,3-dimethyl-3-(t-butylperoxy)butanol, 1,3-dimethyl-3-(t-amylperoxy)butanol and their mixtures.

Some monoperoxycarbonates, such as OO-tert-butyl O-(2-ethylhexyl) monoperoxycarbonate, OO-tert-butyl O-isopropyl monoperoxycarbonate, OO-tert-amyl O-(2-ethylhexyl) monoperoxy carbonate and their mixtures, can also be used.

Among the diacyl peroxides, the preferred peroxide is benzoyl peroxide.

Among the peroxyketals, the preferred peroxides are selected from the group consisting of 1,1-di(t-butylperoxy)-3,3,5-trimethylcyclohexane, n-butyl 4,4-di(t-butylperoxy)valerate, ethyl 3,3-di(t-butylperoxy)butyrate, 2,2-di(t-amylperoxy)propane, 3,6,9-triethyl-3,6,9-trimethyl-1,4,7-triperoxynonane (or methyl ethyl ketone peroxide cyclic trimer), 3,3,5,7,7-pentamethyl-1,2,4-trioxepane, n-butyl 4,4-bis(t-amylperoxy)valerate, ethyl 3,3-di(t-amylperoxy)butyrate, 1,1-di(t-butylperoxy)cyclohexane, 1,1-di(t-amylperoxy)cyclohexane and their mixtures.

Preferably, the peroxyesters are selected from the group consisting of tert-butyl peroxybenzoate, tert-butyl peroxy-2-ethylhexanoate, tert-butyl peroxy-3,5,5-trimethylhexanoate and their mixtures.

Particularly preferably, the organic peroxide is selected from the group consisting of dicumyl peroxide, aryl or diaryl peroxides, diacetyl peroxide, benzoyl peroxide, dibenzoyl peroxide, di(tert-butyl) peroxide, tert-butyl cumyl peroxide, 2,5-bis(tert-butylperoxy)-2,5-dimethylhexane, n-butyl 4,4-di(tert-butylperoxy)valerate, OO-(t-butyl) 0-(2-ethylhexyl)

monoperoxycarbonate, tert-butyl phenoxyisopropyl carbonate, tert-butyl peroxybenzoate, tert-butyl peroxy-3,5,5-trimethylhexanoate, 1,3(4)-bis(tert-butylperoxyisopropyl)benzene and the mixtures of the latter, more preferentially selected from the group consisting of dicumyl peroxide, n-butyl 4,4-di(tert-butylperoxy)valerate, OO-(t-butyl)O-(2-ethylhexyl) monoperoxycarbonate, tert-butyl phenoxyisopropyl carbonate, tert-butyl peroxybenzoate, tert-butyl peroxy-3,5,5-trimethylhexanoate, 1,3(4)-bis(tert-butylperoxyisopropyl)benzene and the mixtures of the latter.

When it is present, the total content of peroxide in the composition is preferably greater than or equal to 0.3 part by weight per hundred parts by weight of polymer, more preferentially greater than or equal to 0.75 part by weight per hundred parts by weight of polymer, preferably within a range extending from 0.5 to 5 parts by weight per hundred parts by weight of polymer, in particular from 0.5 to 3 parts by weight per hundred parts by weight of polymer.

The piezoelectric composite material of the invention can be manufactured by any known technique.

In general, the dispersion of the piezoelectric inorganic fillers in the polymeric matrix is carried out in the presence of the ionic liquid, the material is optionally crosslinked when the polymeric matrix comprises at least one elastomer, in particular thermoplastic and/or diene elastomer, then the composite material is placed in an electric field suitable for making possible a polarization of the piezoelectric inorganic fillers and thus obtaining the piezoelectric composite material.

The dispersion of the piezoelectric inorganic fillers in the polymeric matrix in the presence of the ionic liquid is carried out by any means known per se to a person skilled in the art, in particular for example by twin-screw extrusion or by compounding in an internal mixer.

The stage of polarization of the inorganic fillers is carried out by known means suitable for converting the piezoelectric inorganic fillers into fillers exhibiting piezoelectric properties at the macroscopic scale. The stage of polarization of the device thus corresponds to the application of an electric field to the terminals of the electroactive device in order to orient the dipoles of the piezoelectric fillers in the same direction in order to obtain a macroscopic polarization of the composite material.

The polarization depends on the polarization temperature, on the electric field applied and on the polarization time.

Advantageously, the polarization temperature is at least lower by 5° C., with respect to the lowest Curie temperature, Tc, of the piezoelectric inorganic fillers, more advantageously at least 7° C. less, more advantageously still at least 10° C. less, than the lowest Curie temperature, Tc, of the piezoelectric inorganic fillers. This is because, close to the Curie temperature of the piezoelectric inorganic fillers, the agitation of the dipoles makes it more difficult to align them under an electric field.

The Curie temperature, Tc, of a piezoelectric material corresponds to the temperature at which the material becomes paraelectric. Thus, the characteristic hysteresis cycle of the piezoelectric material, which is obtained by plotting the polarization as a function of the electric field applied to the material, disappears when the Curie temperature is reached. The Curie temperature is a characteristic of the piezoelectric material.

In particular, the electric field applied during the polarization stage can be within a range extending from 0.1 to 10 kV/mm, advantageously from 0.5 to 5 kV/mm.

In particular, the electric field applied depends on the nature of the piezoelectric inorganic filler, on the polarization time of the piezoelectric composite and on the content of ionic liquid present in the material. A person skilled in the art knows how to adjust the electric field to the piezoelectric filler and to the polarization time.

In particular, the polarization time can be between 1 minute and 10 hours, preferably between 5 minutes and 2 hours.

Advantageously, the piezoelectric composite material in accordance with the invention is of 0-3 connectivity, comprising particles of piezoelectric fillers dispersed in the polymeric matrix. The connectivity depends on the spatial organization of each constituent phase of the composite material. A change in connectivity results in major changes in the physical properties of the composites. In the case of two-phase systems, the nature of the connectivity is represented by two numbers (the first for the ceramic, the second for the matrix). They indicate the number of directions connected by the phase under consideration. Thus, a 0-3 connectivity composite corresponds to a composite formed by piezoelectric powder grains dispersed in the polymeric matrix. The main advantage of this type of composite is the ease of implementation of the process, or else the ease of producing complex shapes, such as curved surfaces.

Another subject-matter of the invention is a device comprising at least one layer based on at least one piezoelectric composite material defined above and on at least two conductive electrodes, in particular positioned on either side of said layer.

The electrodes are known to a person skilled in the art. They are deposited on the faces of the piezoelectric composite material of the invention in order to collect the electric charges emitted by said material. They can be facing each other. Their dimensions are suitable for the envisaged application.

The electrodes can be made of metal or metal oxide in the form of a thin deposit of these metals or of these metal oxides. For example, the electrodes can be made of indium tin oxide, of a metallic material, such as silver, gold, nickel, palladium, aluminium, copper, titanium or an alloy or a mixture of at least two of these materials. The electrodes made of metal or of metal oxide can be formed by an "additive" process, for example by the direct printing of a fluid or viscous composition comprising the metal or the metal oxide making up the electrodes, at the desired locations, for example by inkjet printing, heliography, screen printing, flexography, spray coating, drop casting or by chemical vapour deposition. The formation of the electrodes made of metal or of metal oxide can correspond to a subtractive process, in which the material making up the electrodes is deposited over the whole of the piezoelectric composite material and in which the unused portions are subsequently removed by photolithography or laser ablation, for example. According to the metallic material under consideration, the deposition over the whole of the piezoelectric composite material of the invention can be carried out by the liquid route, by cathode sputtering or by evaporation.

The electrodes can be flexible, such as a mixture of thermoplastic or diene elastomers rendered conductive, or such as a conductive polymer, such as, for example, poly (3,4-ethylenedioxythiophene).

Use may be made, as flexible electrodes, for example, of a layer E comprising a conductive rubber composition based on at least 50 phr of diene elastomer, on a crosslinking system and on a graphitized or partially graphitized carbon black.

The diene elastomers which are suitable for the conductive rubber composition of the layer E are those described above for the piezoelectric composite material. The diene elastomer of the conductive rubber composition of the layer E can be identical to or different from that of the piezoelectric composite material of the invention; preferably, it is identical to of the piezoelectric composite material of the invention.

The crosslinking system which is suitable for the conductive rubber composition of the layer E is that described above for the piezoelectric composite material of the invention. The crosslinking system of the conductive rubber composition of the layer E can be identical to or different from that of the piezoelectric composite material of the invention; preferably, it is identical to that of the piezoelectric composite material of the invention.

The graphitized or partially graphitized carbon black is any graphitized or partially graphitized carbon black having an oil absorption number OAN of greater than or equal to 155 ml/100 g, more preferentially of greater than or equal to 160 ml/100 g.

Preferably, the graphitized or partially graphitized carbon black can have a particle size within a range extending from 50 to 500 µm. The amount of graphitized or partially graphitized black in the conductive rubber composition of the layer E is within a range extending from 10% to 40% by volume, preferably from 15% to 30% by volume, with respect to the total volume of the conductive rubber composition. Preferentially, the conductive rubber composition of the layer E does not comprise piezoelectric inorganic filler.

The conductive rubber composition of the layer E is manufactured in an appropriate mixer, using, for example, two successive phases of preparation according to a general procedure well known to a person skilled in the art: a first phase of thermomechanical working or kneading (sometimes described as "non-productive" phase) at high temperature where the constituents of the layer E, except for the crosslinking system, are mixed, up to a maximum temperature of between 80° C. and 190° C., preferably between 80° C. and 150° C., followed by a second phase of mechanical working (sometimes described as "productive" phase) at lower temperature, typically of less than 80° C., for example between 60° C. and 80° C., during which finishing phase the crosslinking system is incorporated. At the end of the productive phase, the conductive rubber composition is extruded or calendered to form a flexible layer E.

The device of the invention can be manufactured by any means known to a person skilled in the art. The layers E forming the electrodes are deposited on the faces of the piezoelectric composite material of the invention in order to collect the electric charges emitted by said material. The device according to the invention is advantageously connected to an electronic member in order to capture the electrical pulses emitted and to use this information.

Mention may be made, as example of the manufacture of the device with flexible layers E, of the following protocol: the layers E and the piezoelectric composite material can be manufactured separately as explained above, then the piezoelectric composite material is placed between two conductive layers E which are identical or different, preferably identical, in order to obtain an assembly, then pressure is applied to the assembly and the assembly is optionally crosslinked in order to obtain the device according to the invention. The layers can be successively deposited in a suitable mould, called a curing mould, which can have any dimension. It is possible to use a pressure ranging from 1 000 000 to 20 000 000 Pa, advantageously ranging from 1 500 000 to 10 000 000 Pa. This pressure is applied to the assembly. The duration of the compression is adjusted according to the pressure chosen; it can, for example, last from 5 min to 90 min. The crosslinking can be carried out by curing, that is to say by heating the assembly to a temperature generally of between 130° C. and 200° C., for a sufficient time which can vary, for example, between 5 and 90 min depending in particular on the curing temperature, on the crosslinking system adopted and on the crosslinking kinetics of the compositions under consideration. The pressurizing and crosslinking stages can be simultaneous. For example, when the layers are deposited in a curing mould, this mould can be deposited in a plate press, where the assembly will be cured under pressure.

When the layers E are metal layers, the piezoelectric composite material can be manufactured as explained above, then the layers E are applied according to one of the processes for the manufacture of these layers as explained above.

The process for the preparation of the device of the invention can advantageously comprise a polarization stage described above.

The device is advantageously connected to an electronic member in order to capture the electrical pulses emitted and to use this information.

The device according to the invention and mentioned above can be used in combination with a sensor.

The invention also extends to the use of such a piezoelectric composite material defined above in the manufacture of structural parts and of supported films deposited over all or part of the surface of such a support.

In particular, the piezoelectric composite material according to the invention and/or the device according to the invention are used to make possible the detection of a mechanical stress at the surface of said composite material by direct piezoelectric effect.

The detection of a mechanical stress can be carried out in a very wide field of technical applications, such as aeronautics, motor vehicles, health, tyres, transportation, and the like.

Another subject-matter of the invention is a tyre comprising the abovementioned device comprising the piezoelectric composite material according to the invention and electrodes. In particular, said device can be fixed, for example, to the interior airtight layer of said tyre, that is to say to the layer which is in contact with the inflation air of the tyre. The fixing can be carried out by conventional means known to a person skilled in the art, such as the scraping off of the lining cement, the use of cold vulcanization or also TPE fusion. The fixing can be carried out by adhesive bonding with an adhesive.

Other advantages will become apparent on reading the following description, which refers to examples given without implied limitation.

EXAMPLES

The aim of the examples presented below is to compare the piezoelectric properties of the piezoelectric composite materials M1, M2 and M3 in accordance with the invention, in comparison with a piezoelectric composite material C not in accordance.

Unless otherwise mentioned, the contents of the various constituents of the piezoelectric composite materials presented in Table 1 are expressed as parts by weight per 100 parts by weight of polymer. All the composite materials exhibit a content of piezoelectric inorganic fillers of 33% by volume, with respect to the total volume of the composite material.

TABLE 1

| Material | C | M1 | M2 | M3 |
|---|---|---|---|---|
| Polymeric matrix (1) | 100.00 | 100.00 | 100.00 | 100.00 |
| Piezoelectric inorganic filler (2) | 320.10 | 322.80 | 326.30 | 334.60 |
| Ionic liquid (3) | (—) | 1.00 | 2.00 | 5.00 |
| Crosslinking system (4) | 0.75 | 0.75 | 0.75 | 0.75 |

(1) Polymeric matrix: Styrene-butadiene copolymer (SBR), solution-polymerized (S-SBR), non-functional, non-extended. Its microstructure is as follows: 24 mol % of 1,2-polybutadiene units, with respect to the butadiene part, and 26.5% by weight of styrene units, with respect to the total weight of the copolymer. It has a Tg = −48° C. The glass transition temperature, Tg, is measured in a known way by DSC (Differential Scanning Calorimetry) according to Standard ASTM D3418 of 1999. The microstructure of the S-SBR (relative distribution of 1,2-vinyl, trans-1,4- and cis-1,4-butadiene units) and the quantitative determination of the content by weight of styrene in the S-SBR are determined by near-infrared (NIR) spectroscopy. The principle of the method is based on the Beer-Lambert law generalized for a multicomponent system. As the method is indirect, it involves a multivariate calibration [Vilmin, F., Dussap, C. and Coste, N., Applied Spectroscopy, 2006, 60, 619-29] carried out using standard elastomers having a composition determined by $^{13}C$ NMR. The styrene content and the microstructure are then calculated from the NIR spectrum of an elastomer film approximately 730 µm in thickness. The spectrum is acquired in transmission mode between 4000 and 6200 $cm^{-1}$ with a resolution of 2 $cm^{-1}$ using a Bruker Tensor 3 7 Fourier-transform near-infrared spectrometer equipped with an InGaAs detector cooled by the Peltier effect.
(2) Piezoelectric inorganic filler: $BaTiO_3$: average diameter of the fillers: 500 nm, density 5.85 $g/cm^3$, sold by Inframat Advanced Materials.
(3) Ionic liquid: ENIMAc (1-ethyl-3-methylimidazolium acetate), sold by Sigma-Aldrich. Melting point = −20° C., measured as described in the description.
(4) Crosslinking system: Luperox 231 (1,1-di(t-butylperoxy)-3,3,5-trimethylcyclohexane supported at 40% by weight on calcium carbonate), sold by Arkema.
Process for the preparation of the piezoelectric composite material The piezoelectric composite materials are prepared in an 85 $cm^3$ Polylab internal mixer, filled to 70%, the initial vessel temperature of which is 80° C., the polymeric matrix, the piezoelectric inorganic fillers and the ionic liquid for the composite materials M1, M2 and M3. Thermomechanical working is then carried out at 80 revolutions/min for 3 min until a maximum dropping temperature of 150° C. is reached (non-productive phase). The mixture thus obtained is recovered, it is cooled and then the crosslinking system is added on an external mixer (homofinisher) at a temperature of 25° C., the whole being mixed in 12 cross-passes (productive phase). The materials thus obtained are subsequently calendered in the form of plaques (thickness of 2 to 3 mm) and cured using a press at 150° C. for 20 minutes in a 330 $cm^2$ mould under 8 tonnes.

On conclusion of this operation, it is entirely possible to cut out the laminates with a hollow punch or any other cutting means in order to produce a piezoelectric device with its two electrodes having the shape and the size desired.

The device is subsequently prepared. More specifically, parallelepipeds of 20 mm×80 mm×2 mm (width×length×thickness) (subsequently also referred to as test specimens) are subsequently cutout from the plaques obtained above. To facilitate the polarization and to make possible the measurements, the test specimens are metallized on the two faces having the greatest dimensions. The metallization, in this instance with gold, can be carried out manually with a lacquer or by cathode sputtering or any other known method. In the case in point, a metallizer (Denton Desk V from Denton Vacuum) is used to deposit the two gold electrodes with a current intensity of 40 mA for 25 seconds.

The device is subsequently placed in a bath of silicone oil (Bluesil FLD 47V5000 sold by Bluestar Silicones) for the polarization stage. An MCP Lab Electronics SPN6000A electrical generator is used to apply an electric field for 10 minutes to both terminals of the test specimen (i.e., connected to the two metallized faces). The polarization is carried out at a temperature of 60° C. Two intensities of direct electric fields are used: 1 V/µm (condition A) and 4 V/µm (condition B). Once polarized, the test specimens are short-circuited to evacuate a maximum of residual charges.

Measurement of the Piezoelectric Coefficient $d_{33}$:

The piezoelectric coefficient $d_{33}$ makes it possible to determine the deformation capacity of a composite material, this deformation taking place parallel to the axis of polarization.

The measurement of the electromechanical response of the test specimens is carried out on a dynamic measurement bench. The sample is prestressed with a force of 10 N and then it is subjected to compressive stress with a force of 5 N at a frequency of 1 Hz and at a temperature of 23° C.

The signal generated by the piezoelectric composite material is recovered at the terminals of the sample by a specific jaws platform, then amplified and measured on an oscilloscope.

The charge Q (pC picocoulomb) released at each mechanical stressing is deduced from the peak-to-peak voltage read on the oscilloscope. Thus the piezoelectric coefficient $d_{33}$ (pC/N (picocoulomb/newton)) can be calculated. The coefficient $d_{33}$, known to a person skilled in the art, represents the piezoelectric coefficient measured by application of a stress in the direction parallel to the direction of polarization of the sample. In the case of a parallelepipedal sample, the direction of polarization corresponds to the smallest thickness (direction 3) and the stress is applied along the same thickness (direction 3).

The following notation can be adopted:

$$d_{33} = \Delta P3/\Delta \sigma 3,$$

with $\Delta P3$ the macroscopic polarization variation in the direction 3 and $\Delta \sigma 3$ the stress applied in the direction 3.

This coefficient is calculated by the following formula:

$$d33 = [Q(pC) \times \text{Thickness } (m)]/[\text{Force } (N) \times \text{Length } (m)]$$

in the case where the electrode covers the entire surface of the test specimen.

Results

Table 2 presents the results of measurement of piezoelectric coefficient $d_{33}$ for the three piezoelectric composite materials of the invention in comparison with the control piezoelectric composite material, measured after a polarization according to the condition A or the condition B.

TABLE 2

| Piezoelectric coefficient $d_{33}$ | C | M1 | M2 | M3 |
|---|---|---|---|---|
| Condition A: 1 V/µm | 0.1 | 0.3 | 2.0 | 2.8 |
| Condition B: 4 V/µm | 0.7 | 2.0 | 6.5 | n.m | n.m = not measured

The results of Table 2 show that, for a given polarization condition, for example the condition A, the piezoelectric coefficient $d_{33}$ of the composite materials M1, M2 and M3 according to the invention is very significantly improved in comparison with that of the composite material C outside the invention. This coefficient increases by at least a factor of 300% (comparison of the composite material M1 according to the invention with respect to the composite material C outside the invention). The ionic liquid thus makes it possible, surprisingly, to improve the piezoelectric properties of a composite material to which it is added, after polarization under the same conditions of temperature, of time and of electric field intensity as a composite material not comprising ionic liquid.

The results presented in Table 2 also show that, in order to obtain given piezoelectric properties for a composite material according to the invention (for example a piezoelectric coefficient $d_{33}$=0.2), it is possible either to modulate the electric force of the electric field (composite material M1, condition B) or to modulate the amount of ionic liquid added (composite material M2, condition A). The piezoelectric properties of the composite materials of the invention can thus be modulated easily and simply, which represents another advantage of the present invention.

The invention claimed is:

1. A piezoelectric composite material based on a polymeric matrix and on piezoelectric inorganic fillers, wherein the piezoelectric composite material additionally comprises at least one ionic liquid of general formula $Q^+A^-$, in which $Q^+$ represents a cation selected from quaternary ammonium cations and quaternary phosphonium cations and $A^-$ represents any anion capable of forming a liquid salt at a temperature of less than 100° C.

2. The piezoelectric composite material according to claim 1, wherein $Q^+$ is a quaternary ammonium cation selected from the group consisting of imidazolium cations, pyrazolium cations, pyridinium cations, pyrimidinium cations, tetra($C_1$-$C_6$)alkylammonium cations, guanidium cations and pyrrolidium cations.

3. The piezoelectric composite material according to claim 1, wherein $Q^+$ is an imidazolium cation corresponding to the formula (I):

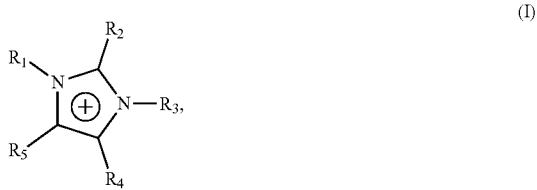

in which $R_1$ represents an alkyl group comprising from 1 to 15 carbon atoms, optionally substituted by one or more $C_6$-$C_{30}$ aryl, thiol or hydroxy groups or interrupted by one or more oxygen or sulfur atoms or by one or more NR' groups, and $R_2$, $R_3$, $R_4$, $R_5$ and R', which are identical or different, each represent a hydrogen atom or an alkyl group comprising from 1 to 6 carbon atoms, or a $C_6$-$C_{30}$ aryl group, optionally substituted by one or more $C_1$-$C_4$ alkyl groups.

4. The piezoelectric composite material according to claim 3, wherein $Q^+$ is selected from the group consisting of 1-ethyl-3-methylimidazolium, 1-butyl-3-methylimidazolium, 1-hexyl-m-methylimidazolium, 1-octyl-3-methylimidazolium, 1-decyl-3-methylimidazolium, 1,3-dibutylimidazolium and 1-butyl-2,3-dimethylimidazolium.

5. The piezoelectric composite material according to claim 1, wherein A is selected from the group consisting of acetate, trifluoroacetate, propionate, chloride, hydroxide, sulfate, trifluoromethanesulfonate, pentafluoromethanesulfonate and phosphates.

6. The piezoelectric composite material according to claim 1, wherein a content of the at least one ionic liquid is greater than or equal to 0.1 part by weight per hundred parts by weight of polymer.

7. The piezoelectric composite material according to claim 1, wherein the piezoelectric inorganic fillers are selected from piezoelectric ceramics.

8. The piezoelectric composite material according to claim 1, wherein the piezoelectric inorganic fillers are selected from the group consisting of barium titanate, lead titanate, lead zirconate titanate, lead niobate, lithium niobate, potassium niobate and mixtures thereof.

9. The piezoelectric composite material according to claim 1, wherein a content of the piezoelectric inorganic fillers is within a range extending from 5% to 80% by volume, with respect to a total volume of the piezoelectric composite material.

10. The piezoelectric composite material according to claim 1, wherein the polymeric matrix comprises at least one polymer selected from the group consisting of thermoplastic polymers, thermoplastic elastomers, thermosetting polymers, diene elastomers and mixtures thereof.

11. The piezoelectric composite material according to claim 1, wherein the polymeric matrix comprises at least one thermoplastic elastomer and/or one diene elastomer.

12. The piezoelectric composite material according to claim 1, wherein the polymeric matrix comprises at least one diene elastomer selected from the group consisting of natural rubber, ethylene/propylene/diene monomer copolymers, synthetic polyisoprenes, polybutadienes, butadiene copolymers, isoprene copolymers and mixtures thereof.

13. The piezoelectric composite material according to claim 11, further comprising at least one crosslinking system.

14. A device comprising at least one layer based on at least one piezoelectric composite material according to claim 1 and on at least two electrodes positioned on either side of the at least one layer.

15. A tire comprising at least one piezoelectric device according to claim 14.

* * * * *